(12) United States Patent
Jagannathan et al.

(10) Patent No.: US 6,744,079 B2
(45) Date of Patent: Jun. 1, 2004

(54) OPTIMIZED BLOCKING IMPURITY PLACEMENT FOR SIGE HBTS

(75) Inventors: Basanth Jagannathan, Beacon, NY (US); Alvin J. Joseph, Williston, VT (US); Xuefeng Liu, South Burlington, VT (US); Kathryn T. Schonenberg, Wappingers Falls, NY (US); Ryan W. Wuthrich, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/683,983

(22) Filed: Mar. 8, 2002

(65) Prior Publication Data

US 2003/0170960 A1 Sep. 11, 2003

(51) Int. Cl.[7] .............................................. H01L 31/072
(52) U.S. Cl. ........................ 257/197; 257/191; 257/592
(58) Field of Search ................................ 257/191, 197, 257/198, 592, 616, 751

(56) References Cited

U.S. PATENT DOCUMENTS 6,362,065 B1 * 3/2002 Swanson et al. ............ 257/198

OTHER PUBLICATIONS

Lanzerotti et al., Suppression of Boron Outdiffusion in Sige HBTs by CArbon Incorporation, IEDM 1996, pp. 249–252.*
L. D. Lanzerotti et al., "Suppression of Boron Outdiffusion in SiGe HBTs by Carbon Incorporation", 1996 IEEE, IEDM 96–249, pp. 10.2.1–10.2.4.
S. R. Stiffler et al., "The role of dislocation–dislocation interactions in the relaxation of pseudomorphically strained semiconductors. II. Experiment The high–temperature relaxation of ultrahigh–vacuum chemical–vapor–deposited SiGe films" J. Appl. Phys. 71 (10), May 15, 1992 p. 4820–4825.
J. W. Matthews et al., " Defects in Epitaxial Multilayers", Journal of Crystal Growth 27 (1974), pp. 118–125.

* cited by examiner

Primary Examiner—Minh-Loan Tran
(74) Attorney, Agent, or Firm—William D. Sabo

(57) ABSTRACT

A high performance SiGe HBT that has a SiGe layer with a peak Ge concentration of at least approximately 20% and a boron-doped base region formed therein having a thickness. The base region includes diffusion-limiting impurities substantially throughout its thickness, at a peak concentration below that of boron in the base region. Both the base region and the diffusion-limiting impurities are positioned relative to a peak concentration of Ge in the SiGe layer so as to optimize both performance and yield.

12 Claims, 2 Drawing Sheets

OPTIMIZED BLOCKING IMPURITY PLACEMENT FOR SIGE HBTS

BACKGROUND OF THE INVENTION

Technical Field

The invention relates to silicon-germanium (SiGe) heterojunction bipolar transistors (HBTs).

It is generally known to form HBTs by using wafers that include one or more layers of silicon germanium (SiGe) on a silicon substrate. On such substrates, the germanium atoms create mechanical strain in the composite film due to the difference in lattice constant between the SiGe film and the silicon substrate. In the plane of the silicon substrate the larger lattice constant of the SiGe lattice is compressed onto the smaller lattice constant of the silicon substrate. In the plane perpendicular to the the silicon substrate, the SiGe layer lattice constant is greater than that of the silicon substrate and thus is under tensile stress. This strain together with the Ge atom itself, creates a bandgap offset between the SiGe film and the underlaying native Si substrate. This bandgap offset provides the unique advantages of the SiGe HBT by creating a grading field in the base to enhance carrier diffusion across the base and thus improve transistor speed. SiGe HBTs have been used as transistors for small signal amplifiers (i.e. switching approximately 5 volts or less) to provide the switching speeds necessary for current wireless communications devices.

SiGe enhances charge mobility by introducing mechanical strain due to the lattice mismatches inherent in the Si—Ge compound; if there is too much Ge, or if the SiGe layer is too thick, the accepted wisdom in the art is that the resulting crystal dislocations will reduce both performance and yield. The performance penalty would be due to dislocations relieving the mechanical stresses that create the bandgap offsets that SiGe provides. The yield penalty would be due to the defects disturbing the crystallography of the substrate. In fact, this general understanding has become so widespread that it is generally acknowledged as the "Matthews-Blakesley stability criterion" or the "Stiffler limit," in recognition of the researchers who first reported these interrelationships (Stiffler et al., Journal of Applied Physics, Vol. 71, No. 10, pp. 4820–4825 (1994); Matthews and Blakeslee, "Defects in Epitaxial Multilayers," Journal of Crystal Growth 27 pp. 118–125 (1974)). For ease of future reference, these results will be referred to as the "SiGe stability limits."

The introduction of carbon (C) or other intert impurty atoms into the SiGebase region via low temperature epitaxy (LTE) growth is an effective way to restrict base boron (B) outdiffusion. Typically, both boron and carbon are introduced into the ambient during the LTE process, at different times and at different concentrations. See for example "Suppression of boron outdiffusion in SiGe HBTs by carbon incorporation," Lanzerotti, L. D.; Sturm, J. C.; Stach, E.; Hull, R.; Buyuklimanli, T.; Magee, C. This paper appears in: Electron Devices Meeting 1996, International, page(s): 249–252, Dec. 8–11, 1996.

In order to enhance the performance of the SiGe HBT, it is preferred to increase the concentration of Ge to above 20% or so. This increases the mobility advantages of SiGe substrates, and is required for applications with an Ft greater than approximately 100 Ghz. However, the inventors found that HBTs built with this high Ge concentration in the presence of a boron-diffusion-limiting impurity (eg. Carbon) suffered from yield issues. Thus, a need has developed in the art for a high performance SiGe HBT with a boron-doped base region and a boron-diffusion-limiting impurity region which avoids yield deterrents.

BRIEF SUMMARY OF THE INVENTION

It is thus an object of the present invention to provide a high performance SiGe HBT with a boron-doped base region and a boron-diffusion-limiting impurity region.

It is another object of the invention to provide a high performance SiGe HBT that does not suffer from performance or yield problems.

The foregoing and other objects of the invention are realized, in a first aspect, by a high performance SiGe HBT that has a SiGe layer with a peak Ge concentration of at least approximately 20% and a boron-doped base region formed therein having a thickness, wherein said base region includes diffusion-limiting impurities throughout said thickness at a concentration below that of boron in said base region, and wherein said diffusion limiting impurities are physically located relative to both said base region and a portion of said SiGe layer having a relatively high concentration of Ge to optimize performance and yield of said SiGe HBT Another aspect of the invention is a high performance SiGe HBT that has a SiGe layer with a peak Ge concentration of at least approximately 20%, a boron-doped base region formed therein having a thickness, and a region of diffusion-limiting impurities at a concentration, thickness, and spacing relative to said base region and a portion of said SiGe layer having a peak concentration of Ge that optimizes both performance and yield of said SiGe HBT.

A further aspect of the invention is a method for forming a high performance SiGe layer on a Si substrate, comprising the steps of introducing germanium atoms during formation of a Si layer; introducing diffusion-limiting impurities and boron atoms during formation of said Si layer, while said germanium atoms are still being introduced; and terminating both said diffusion-limiting impurities and said boron atoms approximately simultaneously, said diffusion limiting impurities being introduced at a concentration and for a duration that optimizes both performance and yield.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE INVENTION

The inventors have found that when the boron diffusion limiting impurity (preferably carbon, but other atoms described elsewhere that provide similar properties could be used) is optimized such that it has a particular peak concentration location relative to the peak Ge concentration, both performance and yield are optimized.

Figure 1:
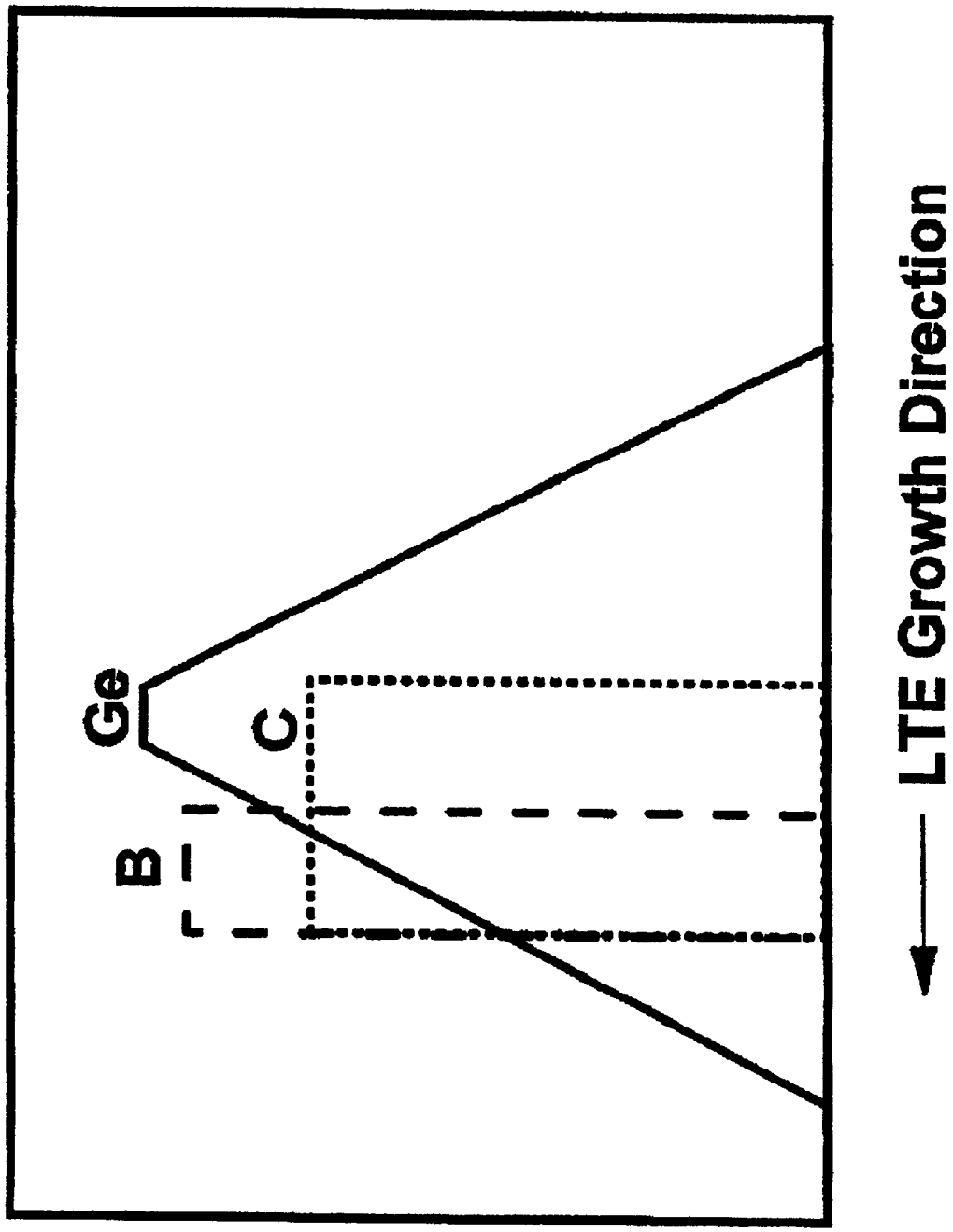
FIG. 1 is a plot of concentration versus thickness of a SiGe HBT during the deposition process.

FIG. 1 is a schematic show of LTE growth profile in accordance with a preferred embodiment of the invention.

At a Ge dose of approximately 4×10 E 16/cm3, the Ge concentration is between approximately 20% to 30% and the total SiGe layer is on the order of 900–300 angstroms (A) in thickness. The Ge has a peak (or plateau) thickness of approximately 100–20 angstroms, respectively, such that the total SiGe layer is within the SiGe stability limit. The phrases "peak thickness" or "plateau" or "peak concentration thickness" refer to the thickness of that portion of the SiGe layer that has the highest concentration of Ge. The base region is approximately 10–150 A in thickness, and features a peak boron concentration B on the order of 5–9×10 E 19/cm3. The carbon C has a peak concentration of 1–4×10 E 19/cm$^3$, and the carbon-doped region has a thickness of approximately 10–500 A in thickness.

Note that FIG. 1 is best understood as being read left-to right, because that indicates the sequence of impurity introduction. As such, note that the carbon is first introduced as of when the Ge reaches it peak concentration, and is terminated when the boron is no longer incorporated into the film. As such, carbon is incorporated at its peak concentration throughout the thickness of the base region.

Figure 2:
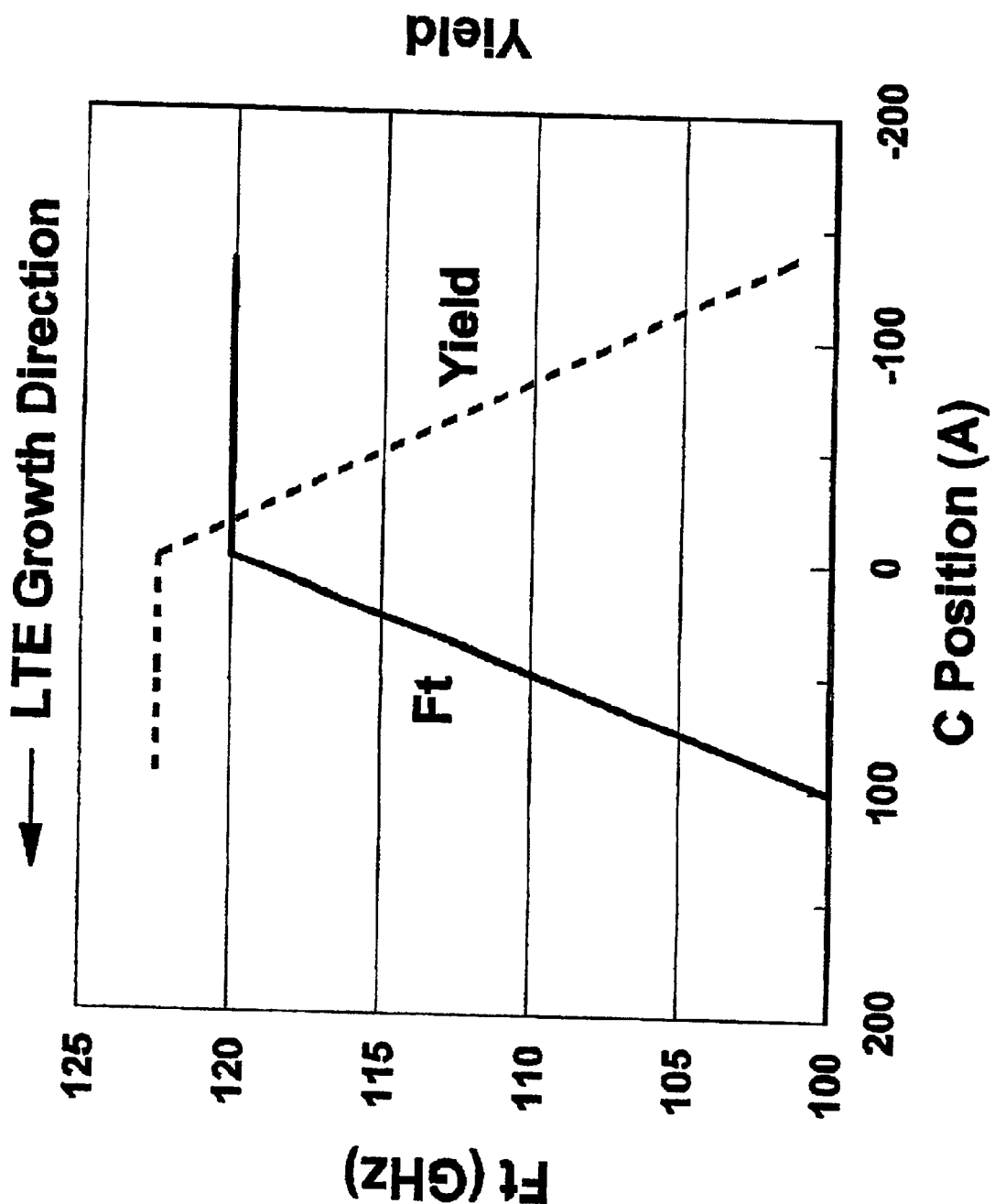
FIG. 2 is a plot of performance versus yield as a function of peak boron diffusion limiting implant versus peak Ge concentration.

The inventors ran a variety of experiments in order to understand the interplay between carbon placement relative to boron placement relative to peak Ge placement. As shown in FIG. 2, it appears that optimized performance results when the boron diffusion-limiting atoms are introduced within approximately 100–150 angstroms of the peak concentration plateau of Ge. As shown, if such atoms are introduced too early, yield degrades significantly. As a practical matter, this yield loss is due to excess carbon atoms that produce a bumpy surface on top of the SiGe film. Yield also decreased if if the C concentration was too high (above approximately 4×10 E 19/cm3). On the other hand, if the atoms were introduced too late, performance degraded due to extended boron diffusion, due to a combination of the peak carbon content not extending enough into the base region and insufficient carbon (below approximately 1×10 E 19/cm3) being incorporated into the base region. Moreover, while not explicitly shown in FIG. 2, note also that the boron region is within approximately 200–250 A of the peak Ge content. The inventors believe this also plays a role in enhancing performance properties of the HBT.

In practice, the optimal concentration profiles and placement are achieved by switching on the Ethylene gas at or about when the peak Germane gas flow rate becomes constant during the low temperature epitaxial (LTE) growth of the SiGe layer on a Si substrate. Specifically, the carbon doped SiGe layer is formed by turning on the Germane flow with a ratio of 1.6 relative to silane, and then ethylene is turned on at a flow ratio of 2.4 relative to silane. Alternate carbon sources could be methylsilane, methane, and other embodiments of C. Specifically, once the Germane gas flow rate ramped up to 28 SCCM, the Ethylene gas is turned on at a rate of 40 SCCM.

An example of the preferred embodiment of the invention is set forth below:

EXAMPLE 1

Base Thickness: 75A Boron peak concentration: 8.5×10 E 19/cm$^3$ Thickness of Ge peak concentration plateau: 50 A Thickness of C layer: 170 A Ge concentration: 25% C peak concentration 1.5×10 E 19/cm$^3$ Resulting Ft: 120 Ghz Resulting Fmax: 100 GHz While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, while in the examples set forth above the Ge concentration that ramps up at a given rate, plateaus for a given thickness, then ramps down at the same rate, such ramp rates and plateau thickness can vary. While the examples above are rendered in the environment of LTE growth of the SiGe layer, other growth environments could be used (e.g. Molecular beam epitaxy (MBE) or ultra high vacuum chemical vapor deposition (UHVCVD)) that may alter the particular deposition parameters utilized. While the SiGe layer is described as having a "plateau" of peak Ge concentration, in practice that "plateau" could range from narrow (an SiGe layer where the peak content is a "point", not a "plateau") to quite wide (up to and including a SiGe layer where the Ge concentration is uniform throughout the SiGe layer), depending upon the exact performance attributes desired in the particular SiGe application of interest.

What is claimed is:

1. A high performance SiGe HBT comprising a SiGe layer with a peak Ge concentration and a boron-doped base region having a thickness, wherein said base region includes diffusion-limiting impurities throughout said thickness at a concentration below that of boron in said base region, wherein said SiGe layer has a thickness that is substantially greater than a peak concentration thickness of the Ge and wherein said diffusion limiting impurities are physically located relative to both said base region and a portion of said SiGe layer and wherein said peak Ge concentration is at least approximately 20% to optimize performance and yield of said SiGe HBT.

2. The device of claim 1, wherein said diffusion limiting impurity comprises carbon.

3. The device of claim 2, wherein said carbon has a peak concentration between approximately 1×10 e 19/cm$^3$ and 4×10 c 19/cm$^3$.

4. The device of claim 2, wherein said carbon defines a dopant region that is approximately 10–500 Å in thickness.

5. A high performance SiGe HBT comprising a SiGe layer with a peak Ge concentration and a boron-doped base region having a thickness, wherein said base region includes diffusion limiting impurities throughout said thickness at a concentration below that of boron in said base region, wherein said diffusion limiting impurities are physically located relative to both said base region and a portion of said SiGe layer, and wherein said peak Ge concentration is at least approximately 20% to optimize performance and yield of said SiGe HBT and wherein and SiGe layer has a thickness of approximately 300–900 Å, and wherein the Ge has a peak concentration thickness of approximately 20–100 Å.

6. The device of claim 5, wherein said base region is approximately 10–150 Å in thickness.

7. The device of claim 6, wherein the base region has a peak boron concentration of boron of approximately 8.5×10 E 19/cm$^3$.

8. A high performance SiGe HBT comprising a SiGe layer with a peak Ge concentration and a boron-doped base region having a thickness, wherein said base region includes diffusion limiting impurities throughout said thickness at a concentration below that of boron in said base region, wherein said diffusion limiting impurities are physically located relative to both said base region and a portion of said SiGe layer, and wherein said peak Ge concentration is at least approximately 20% to optimize performance and yield of said SiGe HBT and wherein said diffusion limiting impurity defines a dopant region having an upper bound and a lower bound, wherein said peak concentration thickness of said Ge has an upper bound and a lower bound, and wherein said lower bound of said diffusion limiting impurity region is within approximately 150 Å of said upper bound of said peak concentration thickness of said Ge.

9. The device of claim 8, wherein said base region is within approximately 200–250 Å of said upper bound of said peak concentration thickness of said Ge.

10. The device of claim 8, wherein said diffusion limiting impurity comprises carbon.

11. A SiGe HBT comprising an a SiGe layer, a base region, and a diffusion-limiting region, in which said diffusion-limiting region extends substantially throughout said base region and has a dopant concentration less than that of said base region, and wherein both said base region and said diffusion-limiting region are spaced within a given distance of a portion of said SiGe layer having a peak Ge concentration of at least approximately 20% so as to optimize both performance and yield of said SiGe HBT, wherein said base region is within approximately 250 Å of said portion of said SiGe layer having a peak Ge concentration.

12. The device of claim 11, wherein said diffusion-limiting region is within approximately 150 Å of said portion of said SiGe layer having a peak Ge concentration.

* * * * *